United States Patent [19]

Hoshi

[11] 4,375,596

[45] Mar. 1, 1983

[54] REFERENCE VOLTAGE GENERATOR CIRCUIT

[75] Inventor: Katsuji Hoshi, Tokyo, Japan

[73] Assignee: Nippon Electric Co., Ltd., Tokyo, Japan

[21] Appl. No.: 208,458

[22] Filed: Nov. 19, 1980

[30] Foreign Application Priority Data

Nov. 19, 1979 [JP] Japan .................... 54-149830

[51] Int. Cl.³ .................... H02J 1/04; H03L 1/00
[52] U.S. Cl. .................... 307/297; 323/313; 307/296 R
[58] Field of Search ............ 307/297, 304, 360–362, 307/364, 473; 323/312, 313, 314–317

[56] References Cited

U.S. PATENT DOCUMENTS

3,795,827  3/1974  Greger .................... 307/448 X
3,806,742  4/1974  Powell .................... 307/297 X
4,270,081  5/1981  Hareyama .................... 323/316

Primary Examiner—Larry N. Anagnos
Attorney, Agent, or Firm—Sughrue, Mion, Zinn, Macpeak and Seas

[57] ABSTRACT

A reference voltage generator circuit which can operate stably irrespective of variations in a power supply voltage and in threshold voltage of transistors employed is disclosed. The reference voltage generator circuit comprises means for dividing a power supply voltage to produce at least one internal voltage, first means responsive to an internal voltage from the dividing means for producing a first output signal having such a response characteristic that the first output signal is increased in value in response to an increase in voltage difference between the internal voltage applied thereto and the threshold voltage, second means responsive to an internal voltage from the dividing means for producing a second output signal having such a response characteristic that the second output signal is decreased in value in response to an increase in voltage difference between the internal voltage applied thereto and the threshold voltage and means averaging the first and the second output signal thereby the generate a constant value of reference voltage.

17 Claims, 6 Drawing Figures

REFERENCE VOLTAGE GENERATOR CIRCUIT

The present invention relates to a circuit formed of semiconductor elements, and more particularly to a reference voltage generator circuit suitable for an integrated circuit employing insulated gate field effect transistors.

In an electronic circuit formed of insulated gate field effect transistors (hereinafter abbreviated as IGFET) or bipolar transistors, especially in a differential amplifier circuit, a constant-current circuit, or the like, a reference voltage having a value different from a power supply voltage is used. For instance, in a differential amplifier circuit, a voltage of a signal to be amplified is compared with a reference voltage and then differential amplification is effected. Accordingly, for a stable operation of the circuit it is necessary that the reference voltage value is stable and not influenced by variations of external conditions such as deviation of a power supply voltage.

At present, in an integrated circuit including MOS transistors, the method of generating a reference voltage within the integrated circuit by making use of an externally applied power supply voltage, is mostly used. In such case it is required that a variation of the reference voltage accompanied by a variation of the power supply voltage should be small and a variation of the reference voltage caused by a variation of a threshold voltage ($V_T$) of a transistor should be also small.

In the currently used reference voltage generator circuit, however, the circuit basically generates a reference voltage by dividing a power supply voltage by making use of threshold voltage characteristics of transistors, and therefore the variation of the power supply voltage and/or the variation of the threshold voltage immediately results in a variation of the reference voltage. Therefore generation of a stable reference voltage has been difficult. Especially, the smaller the reference voltage, the larger is the dependency of the reference voltage upon the threshold voltage. This becomes a large obstacle against the recent tendency toward lowering the power supply voltage.

It is therefore one object of the present invention to provide a reference voltage generator circuit in which a reference voltage having a fixed value can be generated without being influenced by a variation of a power supply voltage.

Another object of the present invention is to provide a reference voltage generator circuit in which a reference voltage having a fixed value can be generated without being influenced by fluctuation and/or variation of a threshold voltage.

The reference voltage generator circuit according to the present invention comprises a first voltage source for supplying a first voltage, a second voltage source for supplying a second voltage, means for generating at least one intermediate voltage between the first and second voltages, first response means responsive to a variation of the intermediate voltage towards the first voltage for shifting its output voltage towards the first voltage, second response means responsive to a variation of the intermediate voltage towards the first voltage for shifting its output voltage towards the second voltage, coupling means for coupling the outputs of the first and second response means, and means for deriving a reference voltage from a junction point of the coupling means.

According to the present invention, the same intermediate voltage could be applied to both the first and second response means. Alternatively, intermediate voltages having different values could be respectively applied to the first and second response means. The above-described coupling means can be realized by making use of a normally conductive IGFET, bipolar transistor or IGFET biased at a conductive condition, a resistor, or the like. The reference voltage could be derived either from the junction between the output of the first response means and the coupling means or from the junction between the output of the second response means and the coupling means.

The reference voltage generator circuit according to the present invention can be effectively applied to a differential amplifier circuit, an integrated circuit having a constant-current circuit and a memory integrated circuit. Especially, the present invention is effective when it is applied to an address inverter buffer necessitating a reference level in a dynamic RAM associated with a 5 V power supply.

According to one feature of the present invention, there is provided a semiconductor circuit comprising a first node where a potential is divided by first and second resistor means between a first voltage source and a second voltage source, a second node where a potential is divided by third and fourth resistor means between the first voltage source and the second voltage source, first load means having its one end connected to the first voltage source, a third node to which the other end of the first load means is connected, a first insulated gate field effect transistor having its drain connected to the third node, its gate connected to the second node and its source connected to the second voltage source, and fifth resistor means connected between the first node and the third node, the first node being used as a reference level point.

According to another feature of the present invention, there is provided a semiconductor circuit comprising a first terminal connectable to a first voltage, a second terminal connectable to a second voltage different from the first voltage, a voltage divider circuit coupled between the first and second terminals for producing at least one internal voltage having a value between the first and second voltages, a first response circuit including a first transistor receiving an internal voltage from the voltage divider circuit, a second response circuit including a second transistor receiving an internal voltage from the voltage divider circuit, the first and the second response circuits producing first and second signals respectively, the first signal being increased in response to an increase in voltage difference between the internal voltage applied to the first transistor and a threshold voltage of the first transistor, the second output signal being decreased in response to an increase in voltage difference between the internal voltage applied to the second transistor and a threshold voltage of the second transistor, and means for mixing the first and second output signals thereby to produce a constant voltage.

The above-mentioned and other features and objects of the present invention will become more apparent by reference to the following description of preferred embodiments of the invention taken in conjunction with the accompanying drawings, wherein:

In the following, all the description will be made by employing MOS transistors (hereinafter abbreviated as MOST) which are representative among insulated gate field effect transistors, and especially description will be made by employing N-channel MOST's. However, with respect to the circuit construction, it is essentially the same even if P-channel MOST's are employed.

Figure 1:
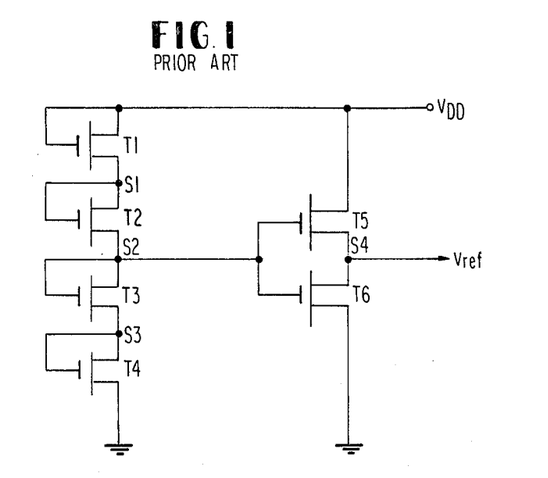
FIG. 1 is a circuit diagram showing a reference voltage generator circuit used in a MOSLSI associated with a 12 V power supply in the prior art.

Referring now to FIG. 1, there is shown a reference voltage ($V_{ref}$) generator circuit in the prior art which has been used for supplying a reference level for an address inverter in a MOS dynamic RAM associated with a 12 V power supply. In the circuit construction of the $V_{ref}$ generator circuit in FIG. 1, enhancement type MOST's (hereinafter abbreviated as EMOST) $T_1$, $T_2$, $T_3$ and $T_4$ are used in the first stage for the purpose of constructing a power supply voltage divider circuit. The drain and gate of the EMOST $T_1$ are connected to a voltage source $V_{DD}$ and its source is connected to a node $S_1$. The drain and gate of the EMOST $T_2$ are connected to the node $S_1$ and its source is connected to a node $S_2$. The drain and gate of the EMOST $T_3$ are connected to the node $S_2$ and its source is connected to a node $S_3$. The drain and gate of the EMOST $T_4$ are connected to the node $S_3$ and its source is connected to the ground. In the second stage, EMOST's $T_5$ and $T_6$ are used for the purpose of generating and controlling the reference voltage $V_{ref}$. The EMOST $T_5$ has a drain connected to the voltage source $V_{DD}$, a gate connected to the node $S_2$ and a source connected to a reference level output node $S_4$. The EMOST $T_6$ has a drain connected to the node $S_4$, a gate connected to the node $S_2$ and a source connected to the ground.

Now, in the first stage voltage divider consisting of the EMOST's $T_1$, $T_2$, $T_3$ and $T_4$ shown in FIG. 1, the ratio of the dimensions of the MOST's ($T_1$ and $T_2$) on the voltage source side versus the MOST's ($T_3$ and $T_4$) on the ground side with respect to the node $S_2$, will be calculated in the following. The currents flowing through the EMOST's $T_1$, $T_2$, $T_3$, $T_4$, $T_5$ and $T_6$ are assumed to be $I_1$, $I_2$, $I_3$, $I_4$, $I_5$ and $I_6$, respectively. The voltages at the respective nodes $S_1$, $S_2$, $S_3$ and $S_4$ are assumed to be $V_1$, $V_2$, $V_3$ and $V_4$, respectively. In addition, a current amplification factor in a saturated region of the EMOST is denoted by $\beta_s$, whereas a current amplification factor in an unsaturated region thereof is denoted by $\beta_t$. Reference character $\alpha$ denotes a substrate constant. Characters $n_1$ and $n_2$ denote dimension ratios of the EMOST's $T_3$ and $T_4$ to $T_1$ and $T_2$ and of $T_5$ to $T_6$ and character $V_T$ denotes a threshold voltage of the EMOST's. Then the following six equations are fulfilled:

$$I_1 = \frac{\beta_s}{2}[V_{DD} - (1+\alpha)V_1 - V_T]^2,$$

$$I_2 = \frac{\beta_s}{2}[V_1 - (1+\alpha)V_2 - V_T]^2,$$

$$I_3 = \frac{\beta_s}{2}[V_2 - (1+\alpha)V_3 - V_T]^2 \times n_1,$$

$$I_4 = \frac{\beta_s}{2}[V_3 - V_T]^2 \times n_1,$$

$$I_5 = \frac{\beta_s}{2}[V_2 - (1+\alpha)V_4 - V_T]^2 \times n_2,$$

$$I_6 = \beta_t[(V_2 - V_T)V_4 - \tfrac{1}{2}V_4^2].$$

From the relation of $I_1=I_2=I_3=I_4$, the voltage $V_2$ at the node $S_2$ can be calculated and represented in terms of $V_{DD}$, $V_T$, and $n_1$ as follows:

$$V_2 = \frac{V_{DD} + (\sqrt{n_1} - 1)(2+\alpha)V_T}{(1+\alpha)^2 + \sqrt{n_1}}$$

Likewise, from the relation of $I_5 = I_6$, the following equation can be derived from the last two equations for the currents $I_5$ and $I_6$ above:

$$n_2 \frac{\beta_s}{\beta_t}[V_{DD} + (\sqrt{n_1} - 1)(2+\alpha)V_T - (1+\alpha)V_4\{(1+\alpha)^2 +$$

$$\sqrt{n_1}\} - \{(1+\alpha)^2 - \sqrt{n_1}\}V_T]^2 = 2\{(1+\alpha)^2 + \sqrt{n_1}\}[\{V_{DD} +$$

$$(\sqrt{n_1} - 1)(2+)V_T - (1+)^2V_T - \sqrt{n_1}\,V_T\}V_4 -$$

$$\tfrac{1}{2}\{(1+\alpha)^2 + \sqrt{n_1}\,V_4\}],$$

With respect to $V_T$, we obtain:

$$n_2 \frac{\beta_s}{\beta_t}[V_{DD} + \{(\sqrt{n_1} - 3)(1+\alpha) - \alpha^2\}V_T -$$

$$(1+\alpha)\{(1+\alpha)^2 + \sqrt{n_1}\}V_4]^2\,2\{(1+\alpha)^2 + \sqrt{n_1}\}[\{V_{DD} +$$

$$(\sqrt{n_1} - 3)(1+\alpha) - \alpha^2\}V_T V_4 - \tfrac{1}{2}\{(1+\alpha)^2 + \sqrt{n_1}\}V_4^2]$$

In order to minimize the dependency of the reference voltage $V_{ref}$, that is, $V_4$ upon the threshold voltage $V_T$, it is only necessary to minimize the coefficient of the term of $V_T$ in the last equation. The minimum value of $\{(\sqrt{n_1}-3)(1+\alpha)-\alpha^2\}$ for a given value of $\alpha$ can be obtained when $\sqrt{n_1}=3$, that is, $n_1=9$ is fulfilled. Accordingly, the desired ratio of the dimensions of the MOST's on the voltage source side versus the MOST's on the ground side with respect to the node $S_2$ in FIG. 1, is 1:9.

The ratio of the dimensions of the EMOST's $T_5$ and $T_6$ in the second stage, that is, in the reference voltage control stage, is selected so that a desired voltage of reference voltage may be obtained. In the case of the power supply voltage $V_{DD}$ of 12 V, in order to obtain an appropriate reference voltage $V_{ref}$ located at the center value 1.5 V between the minimum value of the high level at the input of the address inverter buffer of 2.2 V and the maximum value of the lower level at the same input of 0.8 V, the ratio of the dimensions of the EMOST's $T_5$ and $T_6$ in the second stage in FIG. 1 could be selected at 3:1.

According to the above calculation, the dependency of the reference voltage $V_{ref}$ upon the threshold voltage $V_T$ can be reduced approximately to zero, but the dependency of the reference voltage $V_{ref}$ upon the power supply voltage $V_{DD}$ cannot be eliminated, because the circuit arrangement makes use of the principle of voltage division by resistors for the power supply voltage $V_{DD}$ by employing the EMOST's.

At present, MOS dynamic RAM's associated with a 12 V power supply are predominantly utilized, but as the memory capacity becomes larger, especially after the memory capacity has exceeded 64 K bits, the MOS dynamic RAM's are being modified into those associated with a 5 V power supply. In the case illustrated in FIG. 1, although the dependency of the reference voltage upon the threshold voltage $V_T$ can be eliminated by selecting the ratio of the dimensions of the EMOST's on the power supply side versus the EMOST's on the ground side with respect to the node $S_2$ in the first stage at 1:9, assuming that the reference voltage $V_{ref}$ to be generated is 1.5 V, it can be generated if the power supply voltage $V_{DD}$ is 12 V but it cannot be generated if the power supply voltage $V_{DD}$ is 5 V. This is because in the case of the power supply voltage $V_{DD}$ of 5 V, the voltage $V_2$ at the node $S_2$ is too low. If the ratio of the dimensions in the first stage should be varied so that a reference voltage $V_{ref}$ of 1.5 V may be generated under the condition of the power supply voltage $V_{DD}$ of 5 V, then it would become impossible to eliminate the dependency of the reference voltage $V_{ref}$ upon the threshold voltage $V_T$.

Now the basic circuit construction according to the present invention will be described with reference to FIGS. 2(a), 2(b) and 2(c).

Figure 2A:
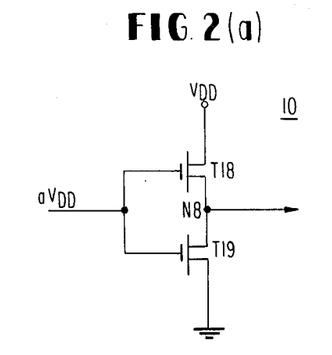
FIGS. 2(a) and 2(b) are circuit diagrams showing two basic circuit blocks to be used according to the present invention.

A first ratio circuit 10 shown in FIG. 2(a) is composed of an EMOST $T_{18}$ having its drain connected to a voltage source $V_{DD}$, its gate connected to a point at a potential level '$aV_{DD}$' (0≦a<1) obtained by dividing a power supply voltage $V_{DD}$ with resistive elements and its source connected to a node $N_8$, and another EMOST $T_{19}$ having its drain connected to the node $N_8$, its gate connected to the point at the potential level '$aV_{DD}$' and its source connected to the ground. The circuit 10 has such a response characteristic that the voltage at the node $N_8$ is raised in proportion to a rise of the power voltage $V_{DD}$, especially the level '$aV_{DD}$' and also in proportion to a fall of the threshold voltage $V_T$ of the transistors ($T_{18}$, $T_{19}$).

Figure 2B:
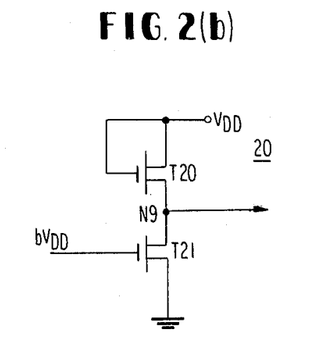

A second ratio circuit 20 shown in FIG. 2(b) is composed of an EMOST $T_{20}$ having its drain and gate connected to a voltage source $V_{DD}$ and its source connected to a node $N_9$, and another EMOST $T_{21}$ having its drain connected to the node $N_9$, its gate connected to a point at a potential level '$bV_{DD}$' (0<b<1) obtained by dividing a power supply voltage $V_{DD}$ with resistive elements and its source connected to the ground.

The circuit 20 has such a response characteristic that the voltage at the node $N_9$ falls in response to the rise of the power voltage $V_{DD}$, especially its divided level '$bV_{DD}$' and in response to a fall of the threshold voltage of the transistors.

Therefore, the circuit 10 and the circuit 20 have the mutually reversed-relation response characteristics with respect to the variations of the power supply voltage $V_{DD}$ and the threshold voltage $V_T$ as detailed below.

Figure 2C:
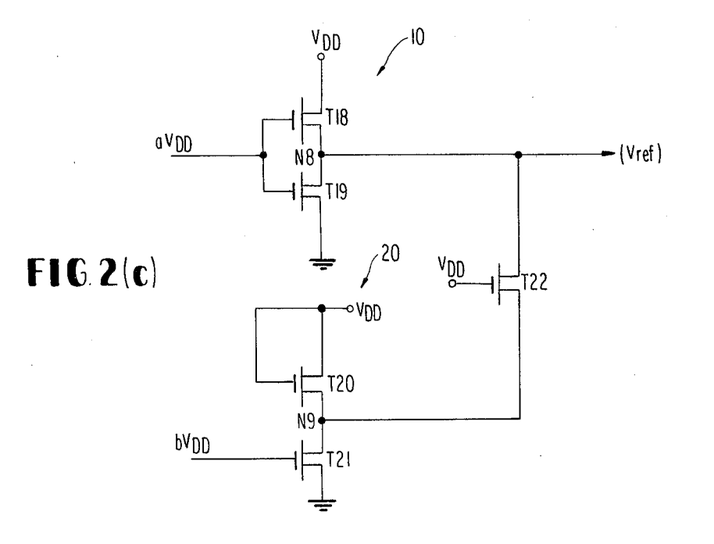
FIG. 2(c) is a circuit diagram showing a basic circuit construction according to the present invention.

The circuit shown in FIG. 2(c) is the basic circuit according to the present invention, in which the nodes $N_8$ and $N_9$ in the circuits 10 and 20 shown in FIGS. 2(a) and 2(b), respectively, are connected through a drain-source path of an EMOST $T_{22}$ forming a load element and having its gate connected to the voltage source $V_{DD}$.

Now representing the voltages at the nodes $N_8$ and $N_9$ by reference characters $V_8$ and $V_9$, respectively, and the currents flowing through the EMOST's $T_{18}$, $T_{19}$, $T_{20}$ and $T_{21}$ by reference characters $I_{18}$, $I_{19}$, $I_{20}$ and $I_{21}$, respectively, mathematical analysis will be carried out in a similar manner to the case of the prior art circuit arrangement in FIG. 1 to represent the node voltages $V_8$ and $V_9$, respectively, as functions of the parameters $V_{DD}$, $n_1$, $n_2$ and $V_T$ which are defined similarly to those used in the analysis of the prior art circuit arrangement.

The currents $I_{18}$, $I_{19}$, $I_{20}$ and $I_{21}$ flowing through the EMOST's $T_{18}$, $T_{19}$, $T_{20}$ and $T_{21}$ in the circuits shown in FIGS. 2(a) and 2(b) are represented by the following equations:

$$I_{18} = \frac{\beta_s}{2} [aV_{DD} - V_T - (1 + a)V_8]^2$$

$$I_{19} = \beta_t[(aV_{DD} - V_T)V_8 - \tfrac{1}{2} V_8^2] \times n_1$$

$$I_{20} = \frac{\beta_s}{2} [V_{DD} - V_T - (1 + a)V_9]^2$$

$$I_{21} = \frac{\beta_s}{2} [bV_{DD} - V_T]^2 \times n_2$$

Substituting $$I_{18} = I_{19} \text{ and } \frac{\beta_t}{\beta_s} = t$$

in the first two equations, we obtain:

$$V_8 = (aV_{DD} - V_T) \cdot \frac{1 + a + n_1 t \pm \sqrt{n_1 t(1 + 2a + n_1 t)}}{(1 + a)^2 + n_1 t}$$

Substituting $I_{20} = I_{21}$ in the last two equations, we obtain:

$$V_9 = \frac{(1 - \sqrt{n_2}\, b)V_{DD} + (\sqrt{n_2} - 1)V_T}{1 + a}$$

From the above equations for the node voltages $V_8$ and $V_9$ it can be seen that as the threshold voltage $V_T$ is raised, the voltage $V_8$ tends to decrease, whereas the voltage $V_9$ tends to increase provided that the dimension $n_2$ of the EMOST $T_{21}$ is selected sufficiently large as compared with unity.

Therefore, it is possible that the nodes $N_8$ and $N_9$ are connected through an EMOST $T_{22}$ and the dimensions of the EMOST's $T_{21}$ and $T_{22}$ are determined so that the dependency of the voltage level $V_8$ at the node $N_8$ which serves as a reference voltage level $V_{ref}$ upon the threshold voltage $V_T$ may disappear. Since the EMOST $T_{22}$ is used merely as a load element, its gate input need not be the power supply voltage $V_{DD}$ and no difference in operation will arise provided that it is at a voltage level approximate to the voltage $V_{DD}$.

Figure 3:
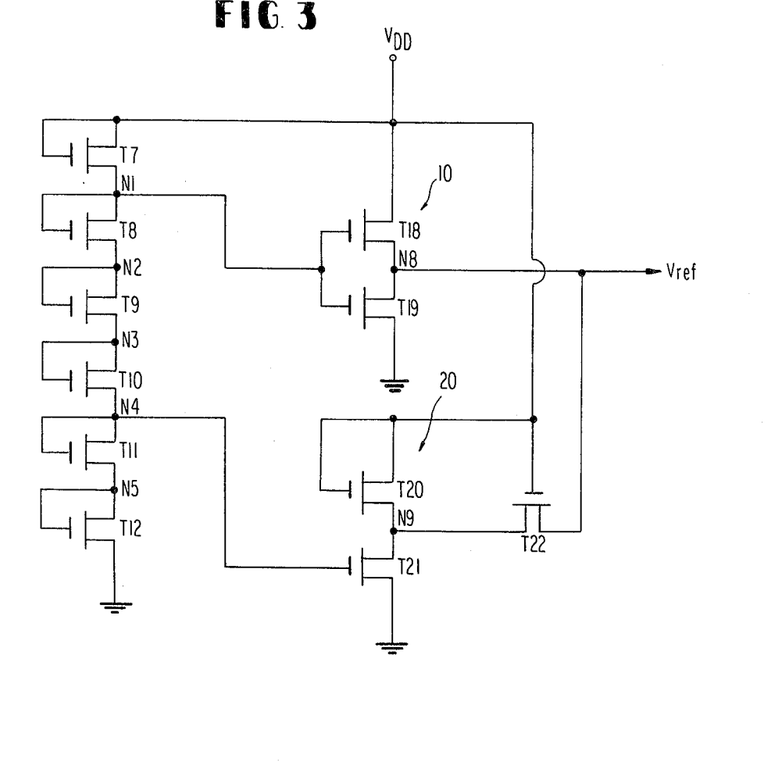
FIG. 3 is a circuit diagram showing a reference voltage generator circuit according to one preferred embodiment of the present invention.

One preferred embodiment of the present invention is illustrated in FIG. 3. This circuit is composed of the circuits 10 and 20 as shown in FIG. 2 and a series circuit for producing '$aV_{DD}$' and '$bV_{DD}$'. Namely it is composed of an EMOST $T_7$ having its drain and gate connected to the voltage source $V_{DD}$ and its source connected to a node $N_1$; an EMOST $T_8$ having its drain and gate connected to the node $N_1$ and its source connected to a node $N_2$; an EMOST $T_9$ having its drain and gate connected to the node $N_2$ and its source connected to a node $N_3$; an EMOST $T_{10}$ having its drain and gate connected to the node $N_3$ and its source connected to a node $N_4$; an EMOST $T_{11}$ having its drain and gate connected to the node $N_4$ and its source connected to a node $N_5$; an EMOST $T_{12}$ having its drain and gate connected to the node $N_5$ and its source connected to the ground; an EMOST $T_{18}$ having its drain connected to the voltage source $V_{DD}$, its gate connected to the node $N_1$ and its source connected to a node $N_8$; an EMOST $T_{19}$ having its drain connected to the node $N_8$, its gate connected to the node $N_1$ and its source connected to the ground; an EMOST $T_{20}$ having its drain and gate connected to the voltage source $V_{DD}$ and its source connected to a node $N_9$; an EMOST $T_{21}$ having its drain connected to the node $N_9$, its gate connected to the node $N_4$ and its source connected to the ground; and an EMOST $T_{22}$ having its drain connected to the node $N_8$, its gate connected to the voltage source $V_{DD}$ and its source connected to the node $N_9$. The node $N_8$ serves as an output for supplying a reference voltage level $V_{ref}$.

The first stage circuit consisting of the EMOST's $T_7$, $T_8$, $T_9$, $T_{10}$, $T_{11}$ and $T_{12}$ is provided for the purpose of dividing the power supply voltage $V_{DD}$, and hence any desired number of EMOST's for obtaining necessary voltage levels could be used in the circuit. In the circuit shown in FIG. 3, the dimension ratio and thus the ratio of conductance between the EMOST's $T_{18}$ and $T_{19}$ is selected at 5:3. The dimension ratio between the EMOST's $T_{20}$ and $T_{21}$ is selected at 1:20. The dimension ratio of the EMOST $T_{22}$ with respect to the EMOST $T_{20}$ is selected at 0.5. Then a reference voltage of 1.4 V which has no dependency upon the threshold voltage $V_T$ and the power voltage $V_{DD}$ can be obtained at the node $N_8$ in the case of the power supply voltage $V_{DD}$ of 5 V.

Figure 4:
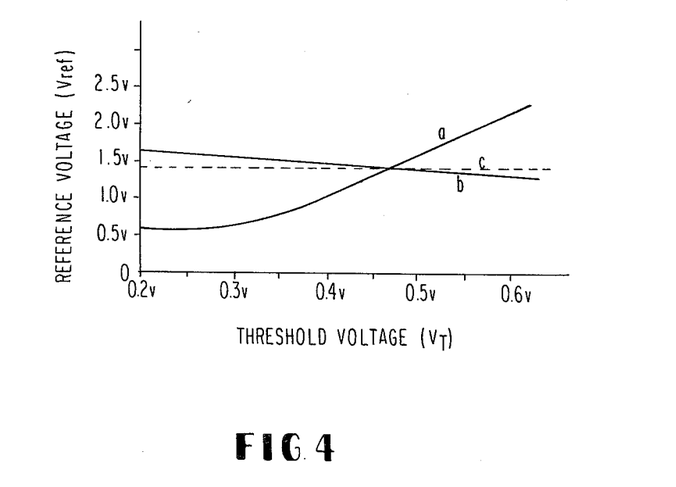
FIG. 4 is a diagram of reference level vs. threshold voltage which is used for explaining the fact that in the circuit shown in FIG. 3 the dependency of the reference level upon the threshold voltage $V_T$ can be eliminated.

In the diagram shown in FIG. 4, curves a and b represent the characteristics of the voltage levels at the nodes $N_8$ and $N_9$, respectively, dependent upon the threshold voltage $V_T$ in the case where the EMOST $T_{22}$ is not present in the circuit shown in FIG. 3, and curve c represents the characteristics of the reference voltage level at the node $N_8$ dependent upon the threshold voltage $V_T$ when the EMOST $T_{22}$ is inserted. In order to make the voltage level at the node $N_8$ independent of the threshold voltage $V_T$ or the voltage $V_{DD}$, in addition to the determination of the dimensions of the EMOST's $T_{20}$ and $T_{21}$, the dimension of the EMOST $T_{22}$ may be selected appropriately.

Now, another preferred embodiment of the present invention as applied to a memory device will be described with reference to FIGS. 5 and 6.

Figure 5:
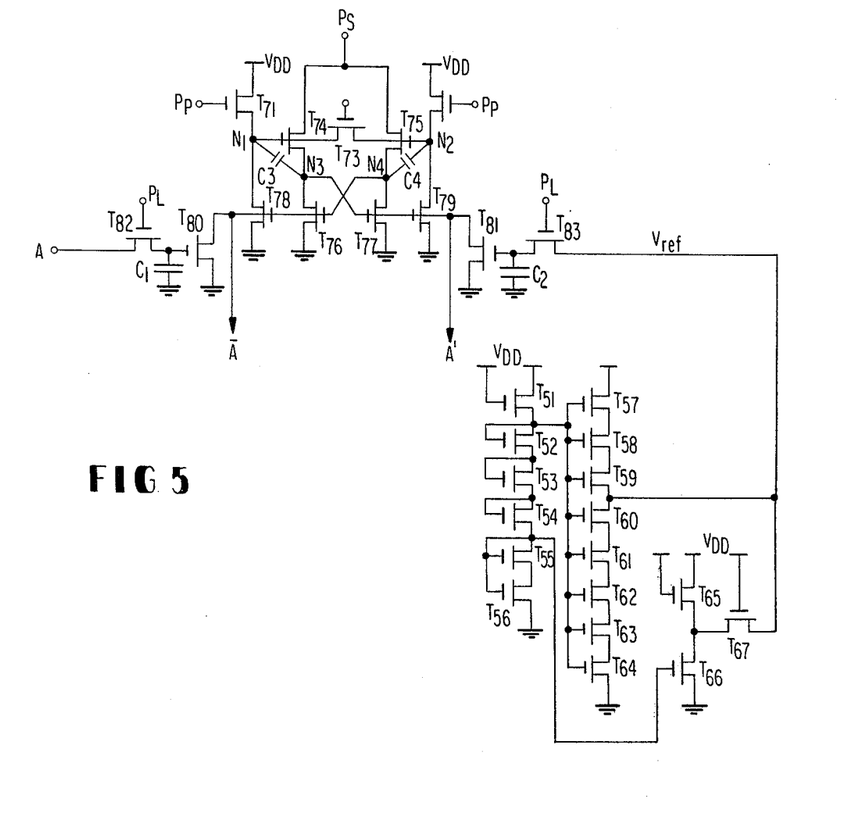
FIG. 5 is a circuit diagram of another preferred embodiment of the present invention as applied to a memory circuit.
Figure 6:
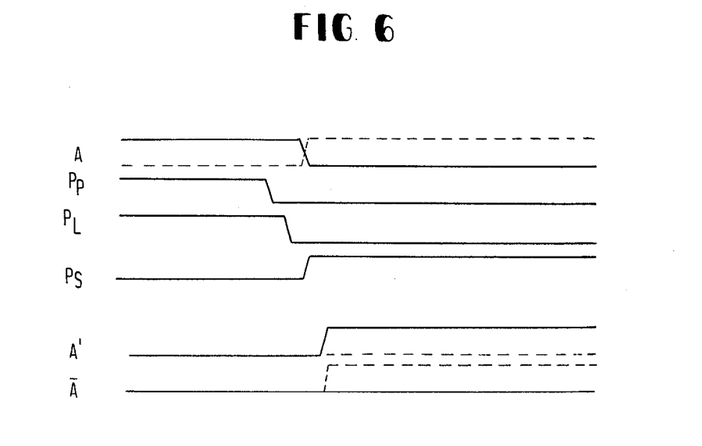
FIG. 6 is a timing chart representing potentials at various points in FIG. 5.

In FIG. 5, MOST's $T_{51}$ to $T_{67}$ form a reference voltage generator circuit according to the present invention in which a series circuit including MOST's $T_{51}$ to $T_{56}$ corresponds to the first stage circuit in FIG. 3 and a circuit including MOST's $T_{57}$ to $T_{64}$ and a circuit including MOST's $T_{65}$ and $T_{66}$ correspond to the circuits 10 and 20 in FIG. 3 respectively, and MOST's $T_{71}$ to $T_{83}$ constitute an address inverter circuit to be used in a MOS dynamic RAM. Reference characters $P_p$, $P_s$ and $P_l$ denote input signals fed from an internal clock of the RAM. The operation of the circuit shown in FIG. 5 will be explained with reference to a timing chart shown in FIG. 6. However, description of the operation of the reference voltage generator circuit portion in FIG. 5 will be omitted because it is exactly the same as the circuit shown in FIG. 3. It is assumed that the transistors used in this circuit are enhancement type MOS transistors. In the initial condition, since the input signal $P_p$ for precharging which is derived from an internal clock of the RAM is at a high voltage well exceeding the threshold voltage $V_T$ of the EMOST's (hereinafter called "high level"), the EMOST's $T_{71}$ and $T_{72}$ are activated and thus precharge node $N_1$ and $N_2$ at a voltage that is lower than the power supply voltage $V_{DD}$ by the threshold voltage $V_T$. Then an EMOST $T_{73}$ which has the nodes $N_1$ and $N_2$ connected to its source and drain, respectively, is activated in response to its gate input $P_p$, and hence maintains the nodes $N_1$ and $N_2$ at the same potential to stabilize the circuit. When the precharge signal $P_p$ is lowered to a voltage lower than the threshold voltage $V_T$ (hereinafter called "low level"), the input signal $P_L$ for latching applied signals, which is derived from the internal clock of the RAM, also becomes a low level subsequently, so that EMOST's $T_{82}$ and $T_{83}$ are turned OFF and thus an address input A and a reference voltage $V_{ref}$ which are applied to the respective drains are maintained in capacitors $C_1$ and $C_2$, respectively, which are connected to the source of the respective EMOST's. In the following, description will be made assuming the case where the address input A is at a higher level than the reference voltage $V_{ref}$. After the latch signal $P_L$ has become a low level, the input signal $P_S$ for activating the address inverter circuit which is derived from the internal clock of the RAM becomes a high level, and the signal $P_S$ is applied to drains of EMOST $T_{74}$ and $T_{75}$ having their gates connected to the nodes $N_1$ and $N_2$ which have been already raised to a high level, to precharge nodes $N_3$ and $N_4$. Then EMOST's $T_{80}$ and $T_{81}$ whose gate inputs are nodes $N_5$ and $N_6$ connected to the capacitors $C_1$ and $C_2$, respectively, lower their respective drain inputs at the nodes $N_4$ and $N_3$, respectively, with capabilities corresponding to their gate input voltages, and thus achieve flip-flop operation. In the case where the address input A is higher than the reference voltage $V_{ref}$, the node $N_5$ is charged up to a higher voltage than the node $N_6$, and as a result of the above-mentioned flip-flop operation, the node $N_3$ becomes a high level, while the node $N_4$ becomes a low level. Then, since a bootstrap circuit is formed of the EMOST $T_{74}$ and a capacitor $C_3$, the node $N_3$ rises up to the power supply voltage $V_{DD}$, and hence the voltages at the nodes $N_3$ and $N_4$ are applied to a decoder in the next stage as an in-phase output A' and an out-of-phase output A for the address input A.

As described above, according to the present invention, a reference voltage generator circuit which is free from threshold voltage dependency and deviation of the power voltage can be obtained by connecting, via a MOST, two nodes which present opposite tendencies to each other in the output level change caused by the variation of the threshold voltage $V_T$ and/or the power supply voltage V$_{DD}$; and also a reference voltage generator circuit which satisfies the conditions of association with a 5 V power supply and a center level value of 1.5 V that could not fulfilled by the prior art circuits and yet which is free from the threshold voltage dependency, can be realized.

I claim:

1. A circuit comprising means for receiving a power supply voltage, dividing means for producing first and second divided voltages by dividing said power supply voltage, first response means receiving said first divided voltage for generating a first voltage whose value is increased from its initial value as said first divided voltage increases in value, second response means receiving said second divided voltage for generating a second voltage signal whose value is decreased from its initial value as said second divided voltage increases in value, means coupled to output terminals of said first and second response means for producing an averaged voltage signal of said first and second voltage signals, the averaged voltage signal having substantially constant value irrespective of increase in said power supply voltage, and means for outputting said averaged voltage signal.

2. The circuit according to claim 1, in which said dividing means includes a plurality of serially connected insulated gate field effect transistors.

3. The circuit according to claim 1, in which said first response means includes a first insulated gate field effect transistor having a drain connectable to said power supply voltage; a second insulated gate field effect transistor having a drain connected to a source of said first transistor and a source connectable to a ground potential; and means for supplying gates of said first and second transistors with said first divided voltage, conductance of said first transistor being larger than that of said second transistor.

4. The circuit according to claim 1, in which said second response means includes an inverter circuit having an input terminal receiving said second divided voltage.

5. The circuit according to claim 1, in which said producing means includes an insulated gate field effect transistor connected between said output terminals of said first and second response means.

6. A constant voltage generator circuit comprising a first terminal connectable to a first voltage, a second terminal connectable to a second voltage different from said first voltage, a voltage divider circuit coupled between said first terminal and said second terminal, said voltage divider circuit producing first and second intermediate voltages having values between said first and second voltage, a first voltage response circuit including a first insulated gate field effect transistor receiving said first intermediate voltage from said voltage divider circuit, said first voltage response circuit producing a first output signal, a voltage value of said first output signal being increased in response to an increase in voltage difference between said first intermediate voltage applied to said first voltage response circuit and a threshold voltage of said first insulated gate field effect transistor, a second voltage response circuit including a second insulated gate field effect transistor receiving said second intermediate voltage from said voltage divider circuit, said second voltage response circuit producing a second output signal, a voltage value of said second output signal being decreased in response to an increase in voltage difference between said second intermediate voltage applied to said second voltage response circuit and a threshold voltage of said second insulated gate field effect transistor, and means for mixing said first output signal and said second output signal thereby to produce a constant voltage.

7. The circuit according to claim 6, in which said voltage divider circuit includes a plurality of insulated gate field effect transistors connected in series between said first and second terminals.

8. The circuit according to claim 7, in which said mixing means includes a third insulated gate field effect transistor having a drain supplied with said first output signal and a source supplied with said second output signal and means for making said third transistor conductive.

9. The circuit according to claim 6, further comprising means for receiving a digital signal, a flip-flop circuit having a pair of input points, means for supplying one of said input points with said digital signal, and means for supplying the other of said input points with said constant voltage.

10. A semiconductor circuit comprising first impedance means connected between a first voltage source and a first node, second impedance means connected between the first node and a second node, third impedance means connected between the second node and a second voltage source, a first transistor having its drain connected to the first voltage source, its gate connected to the first node and its source connected to a third node, a second transistor having its drain connected to the third node, its gate connected to the first node and its source connected to the second voltage source, fourth impedance means having one end connected to the first voltage source and the other end connected to a fourth node, a third transistor having its drain connected to the fourth node, its gate connected to the second node and its source connected to the second voltage source, and fifth impedance means connected between the third node and the fourth node, a reference level being derived from the third node.

11. A circuit comprising a first terminal for receiving a first voltage, a second terminal for receiving a second voltage, a series circuit coupled between said first terminal and said second terminal and including a plurality of field effect transistors each having a gate coupled to a drain thereof, said series circuit generating first and second intermediate voltages having values between said first voltage and said second voltage, a first ratio circuit coupled between said first terminal and said second terminal and including a first insulated gate field effect transistor having a gate receiving said first intermediate voltage and means for connecting a drain of said first insulated gate field effect transistor to said first terminal, said first ratio circuit generating a first potential from a source of said first transistor, the value of said first potential being shifted towards said first voltage in response to an increase in the voltage difference between said first intermediate voltage and a threshold voltage of said first transistor, a second ratio circuit coupled between said first terminal and said second terminal and including a second insulated gate field effect transistor having a gate receiving said second intermediate voltage and means for connecting a source of said second transistor to said second terminal, said second ratio circuit generating a second potential from a drain of said second transistor, the value of said second potential being shifted towards said second voltage in response to an increase in voltage difference between said second intermediate voltage and a threshold voltage of said second transistor, and means for coupling output terminals of said first and second ratio circuit to generate a constant potential.

12. The circuit according to claim 11, in which said first ratio circuit further includes a third insulated gate field effect transistor coupled between the source of said first transistor and said second terminal and having a gate receiving said first intermediate voltage.

13. The circuit according to claim 12, in which dimension of said first transistor is larger than that of said third transistor.

14. The circuit according to claim 11, in which said second ratio circuit further includes an impedance element coupled between the drain of said second transistor and said first terminal.

15. The circuit according to claim 11, in which said coupling means includes an insulated gate field effect transistor coupled between the output terminal of said first and second ratio circuits and means for biasing said fourth transistor in conducting state.

16. A voltage generator circuit comprising means for dividing a power supply voltage to produce at least one intermediate voltage having a smaller value than said power supply voltage, first means including at least one field effect transistor and being responsive to said intermediate voltage for producing a first potential signal at a respective first output terminal in such a manner that the first potential signal is increased and decreased in value in response to an increase and a decrease, respectively, in voltage difference between said intermediate voltage and a threshold voltage of the transistor included therein, second means including at least one field effect transistor and being responsive to said intermediate voltage for producing a second potential signal at a respective second output terminal in such a manner that the second potential signal is decreased and increased in value in response to an increase and decrease, respectively, in voltage difference between said intermediate voltage and a threshold voltage of the transistor included therein, and a load means for connecting said output terminals of said first and second means.

17. The circuit according to claim 16, in which said load means includes a field effect transistor coupled between the output terminals of said first and second means.

* * * * *

UNITED STATES PATENT AND TRADEMARK OFFICE
CERTIFICATE OF CORRECTION

PATENT NO. : 4,375,596
DATED      : March 1, 1983
INVENTOR(S) : Katsuji Hoshi

It is certified that error appears in the above-identified patent and that said Letters Patent is hereby corrected as shown below:

Col. 4, line 41, change "$\sqrt{n_1}\ V_4$]" to --$\sqrt{n_1}\ V_4^2$;--;

Col. 5, line 45, change "(021 a<1)" to --(0<a<1)--;

Col. 7, line 50, change "a and b" to --$\underline{a}$ and $\underline{b}$--;

Col. 7, line 54, change "c" to --$\underline{c}$--;

Col. 8, line 61, change "output A" to --output $\overline{A}$--.

Signed and Sealed this

*Twenty-first* Day of *June 1983*

[SEAL]

Attest:

DONALD J. QUIGG

Attesting Officer

Acting Commissioner of Patents and Trademarks